United States Patent [19]

Varnau et al.

[11] 4,309,856
[45] Jan. 12, 1982

[54] PANEL MOUNTING DEVICE AND ASSEMBLY

[75] Inventors: Michael J. Varnau, Bunker Hill; William Gouge, Kokomo, both of Ind.

[73] Assignee: General Motors Corporation, Detroit, Mich.

[21] Appl. No.: 152,384

[22] Filed: May 22, 1980

[51] Int. Cl.³ .................. H05K 7/12; F16B 19/00; H02B 1/02
[52] U.S. Cl. ........................................ 52/506; 52/27; 52/787; 52/788; 52/826; 248/1; 339/17 LM; 361/412; 361/415; 403/231
[58] Field of Search .................. 361/412, 415; 52/506, 52/509, 787, 785, 815, 826, 27, 398; 411/112, 182, 166; 24/305, 323; 248/222.1, 224.4; 211/41; 403/231

[56] References Cited

U.S. PATENT DOCUMENTS

| 3,206,648 | 9/1965 | Jordan, Jr. et al. | 339/17 M X |
|---|---|---|---|
| 3,443,473 | 5/1969 | Tritt | 52/787 X |
| 3,527,280 | 9/1970 | Mac Norius | 403/231 X |
| 3,609,464 | 9/1971 | Stone | 361/412 |
| 3,644,868 | 2/1972 | Nevala | 339/17 LM |
| 3,652,899 | 3/1972 | Henschen | 361/415 |
| 3,811,154 | 5/1974 | Lindeman et al. | |
| 3,812,381 | 5/1974 | Guyton | 361/412 |
| 3,836,704 | 9/1974 | Coules | 361/412 X |
| 3,852,849 | 12/1974 | Pestka | 361/412 X |
| 3,874,766 | 4/1975 | Mizusawa | 339/125 R |
| 3,999,583 | 12/1976 | Nelson | 411/182 |
| 4,057,311 | 11/1977 | Evans | 339/17 M |
| 4,200,900 | 4/1980 | Mc George | 361/412 |

FOREIGN PATENT DOCUMENTS

| 2232385 | 1/1974 | Fed. Rep. of Germany | 411/112 |
|---|---|---|---|
| 772576 | 8/1934 | France | 52/506 |
| 1467378 | 3/1977 | United Kingdom | 52/508 |

Primary Examiner—Alfred C. Perham
Attorney, Agent, or Firm—Warren D. Hill

[57] ABSTRACT

To securely mount at least two panels such as printed circuit boards in spaced parallel relation, a molded plastic spacer device is provided for coupling the panels to a mounting bracket and firmly holding the panels without stress.

2 Claims, 3 Drawing Figures

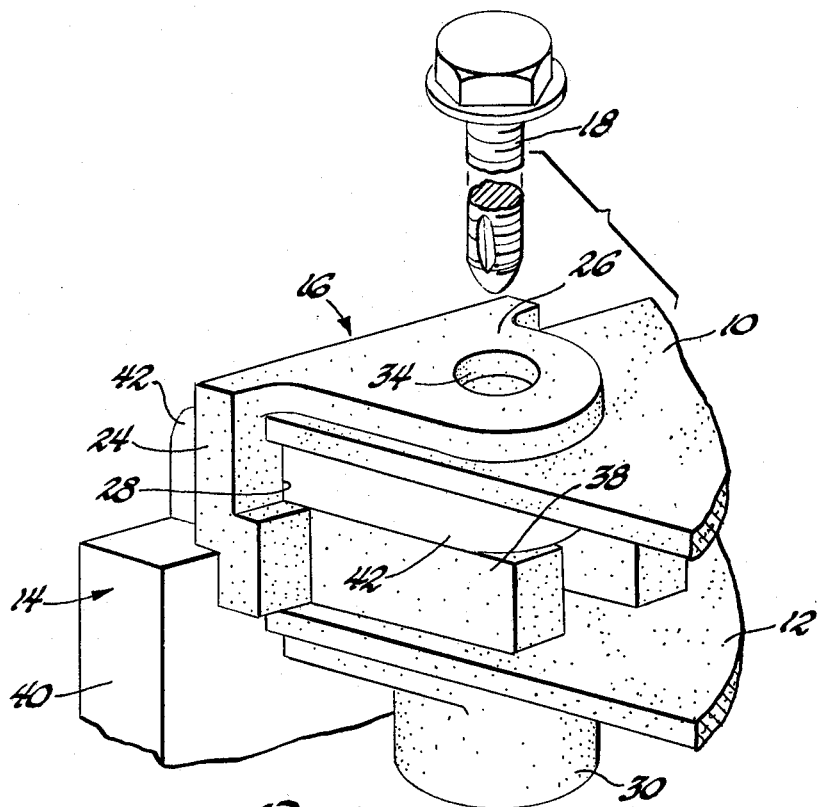
Fig. 1
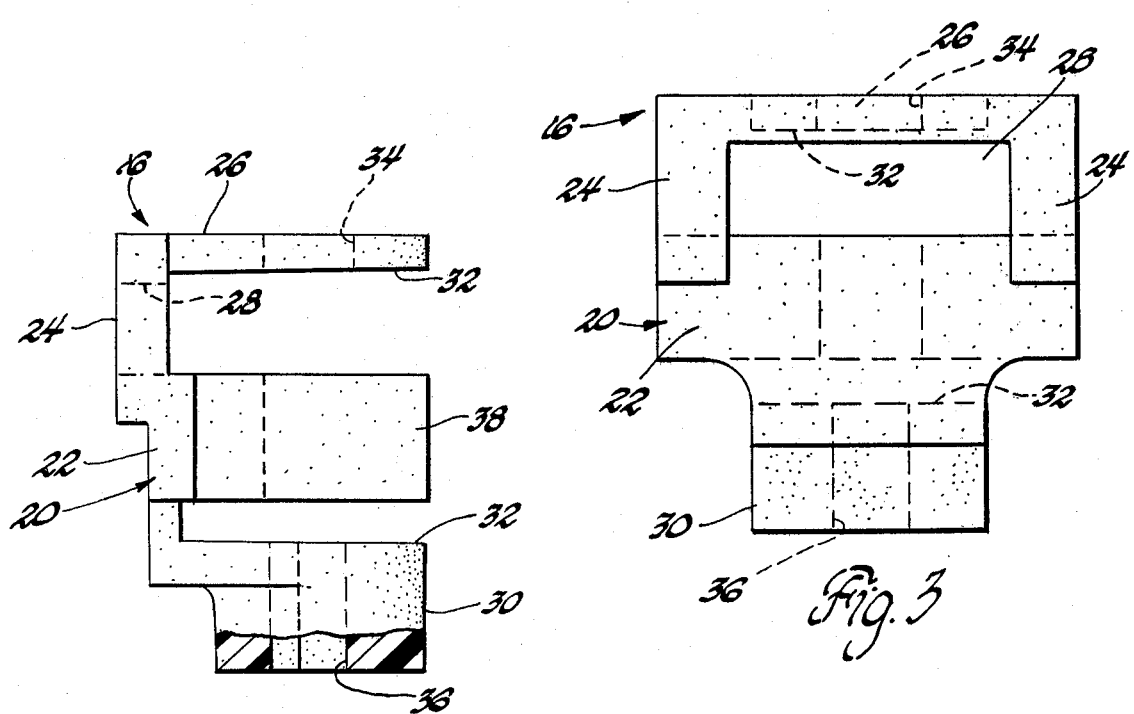
Fig. 2
Fig. 3

PANEL MOUNTING DEVICE AND ASSEMBLY

This invention relates to a panel mounting device for securing panels in parallel spaced relation to a support bracket and to the resulting spaced panel assembly.

It is often desired to securely and accurately mount two or more panels in spaced relation to a support member. For example, printed circuit boards are often positioned in spaced relation in electronic assemblies. Many types of mounting arrangements have been employed such as to build a chassis with tracks to slidably receive the boards. This approach is costly and tight tolerances are necessary, and in addition it effectively precludes using simple interconnecting cables between circuit boards. Securing each panel individually by screws has been used but that requires a component design that provides accessibility to those screws. It has been proposed to cut an access hole in external panels over each screw for the internal panel. However, this results in lost panel space on the external panel and it is difficult to assemble the screw in the recess. Plastic snap fasteners have been available to allow two panels to be fastened together but this requires as much or more space as separate fasteners and in addition introduces an inherent springiness to the assembly which can cause catastrophic resonances during vibration of the overall system.

It is therefore a general object of the invention to provide a spacer device for fastening two or more panels together requiring a single screw at each mounting location. A further object is to provide such a device which allows relatively large variation in panel thickness and which provides accurate spacing of the panels and a high rigidity of the panel assembly.

Another object of the invention is to provide a high rigidity panel assembly which uses a minimum amount of panel area for the mounting structure.

The invention is carried out by providing an integral panel mounting device of resilient material which has an inner spacer with parallel surfaces for cooperation with a mounting bracket to properly space a pair of panels, and a pair of outer lugs which when pulled together by a fastener serve to securely clamp the panels together with the spacer and mounting bracket. The invention is further carried out by providing a panel assembly including an integral panel mounting device, a mounting bracket which cooperatively engages the panel mounting device to provide two parallel surfaces, two panels each mating with one of the parallel surfaces and lugs on the mounting device each engaging another surface of each panel and a fastener for drawing the lugs together for secure clamping of the assembly.

The above and other advantages will be made more apparent from the following specification taken in conjunction with the accompanying drawings wherein like reference numerals refer to like parts and wherein:

FIG. 1 is a perspective view of the panel mounting assembly according to the invention.

FIG. 2 is a side elevational view of a panel mounting device according to the invention, and FIG. 3 is a rear elevational view of the device of FIG. 2.

Referring to FIG. 1 of the drawings a pair of panels or printed circuit boards 10 and 12 in spaced parallel relationship are secured to a mounting bracket 14 by a mounting device 16 and a screw 18. As shown in all the figures, the mounting device 16 is an integral molded plastic device preferably formed of an acetal homopolymer which exhibits high strength across a wide temperature range, toughness, dimensional stability, good moldability and low cost. The device 16 has a rear wall 20 comprising a flat plate 22 and a pair of laterally spaced extensions 24 parallel to the plate 22 and joined at one end to the rear of the flat plate 22 and joined at the other end to a forwardly projecting lug 26 which extends from the rear wall at substantially right angles thereto. The spaced extensions 24, the lug 26 and the plate 22 define an aperture 28 in the rear wall of the mounting device. A second lug 30 is secured at an end of the wall 20 opposite the first lug 26 and similarly projects forwardly substantially at right angles to the wall 20. The inner surfaces 32 of the lugs 26 and 30, that is those surfaces which face each other, are formed with a slight draft, that is, less than two degrees, for ease of moldability and also for improved resilience of the device as will be further illustrated below. The lugs 26 and 30 are provided with aligned apertures 34 and 36 respectively for receiving the screw 18. The aperture 36 is preferably of a substantially triangular design to facilitate engagement by a thread forming screw. The lug 30 is of sufficient thickness to allow adequate screw mating area. A bifurcated spacer 38 projects forwardly from the flat plate 22 of the rear wall 20 intermediate the lugs. The bifurcation allows convenient moldability and, in addition, allows passage of the screw 18. The spacer 38 as shown in FIG. 1 is thinner than the spacer 38 as shown in FIGS. 2 and 3. This illustrates that the thickness of the spacer may be varied as a matter of design to determine, along with the thickness of the mounting bracket tab the spacing of the panels 10 and 12. An important feature of the mounting device 16 is that the surfaces of the spacer 38 which face the lugs are parallel.

Referring to FIG. 1, the mounting bracket 14 has a flat base member 40 parallel to the rear wall 20 of the mounting device and in engagement with the flat plate 22 thereof. The bracket 14 also has an integral tab 42 perpendicular to the base 40 and extending into the aperture 28 in the mounting device 16 such that the tab 42 seats flush against one surface of the spacer 38. The surfaces of the tab 42 are also parallel. The panel 10 is seated flush against the surface of the tab 42 and nests between the tab 42 and the surface 32 of the lug 26. The parts are so dimensioned that the spacing between the tab 42 and the lug 26 approximates the thickness of the panel 10. However, some variations in the panel thickness are not detrimental to a good fit because the resilience of the mounting device allows the lug 26 to be pulled by the screw 18 into snug engagement with the panel 10 for securing that panel firmly against the surface of the tab 42. The panel 12 seats against the other surface of the spacer 38 and nests between the spacer and the surface 32 on the lug 30. The spacer and lug are separated by a space approximately equal to the thickness of the panel 12 so that when the lug 30 is drawn toward the spacer 38 by the screw 18, the panel 12 is securely seated against the spacer 38. Thus, the panels 10 and 12 are secured to parallel surfaces and are subject to no stress or distortion which would arise if the surfaces were not parallel. The thickness of the tab 42 and the spacer 38 accurately determines the spacing of the panels 10 and 12. Both panels, of course, have formed therein apertures aligned with the apertures in the lugs to accept the screw 18.

Typically a pair of printed circuit boards are secured at each of four corners to a chassis comprising a pair of elongated mounting brackets 14 each having a pair of tabs 42 for supporting the panels. Due to the resilience and flexibility of the mounting device, design clearances and material variations can be readily accommodated yet the final assembly has accurate spacing and high rigidity. In addition, the mounting device provides a high damping factor to reduce vibration resonance and when molded of the recommended plastic material provides electrical insulation between the circuit boards. All this is accomplished with a minimal usage of panel surface area and allows easy assembly of the panels to a chassis. Although the description is directed to a device for securing two panels, the design can also be expanded to mounting more than two boards at a time.

The embodiments of the invention in which an exclusive property or privilege is claimed are defined as follows:

1. A panel mounting device for securing at least two panels in parallel spaced relation to a support bracket, comprising
   an integral device of resilient insulating material having a rear wall portion, forwardly projecting lugs attached to the wall portion at the ends thereof, and a forwardly projecting spacer attached to the wall portion intermediate the lugs, the spacer having parallel surfaces facing the lugs, one of the surfaces being spaced from its facing lug by a distance approximately equal to the thickness of the panel to be mounted therein and the other of the surfaces being spaced from its facing lug by a distance approximately equal to the combined thickness of the support bracket and the panel to be mounted therein,
   an aperture in the wall for receiving said support bracket between one of the lugs and the spacer, and
   apertures in the lugs for receiving a fastener for urging the lugs toward the spacer.

2. A spacer panel assembly including
   a support bracket having a tab with parallel first and second faces,
   an integral mounting device of resilient insulating material having a rear wall portion, forwardly projecting lugs attached to the wall portion at the ends thereof, and a forwardly projecting spacer attached to the wall portion intermediate the lugs, the spacer having parallel first and second faces facing the lugs, and an aperture in the wall for receiving said support bracket tab between one of the lugs and the spacer, the first face of the tab engaging the first face of the spacer,
   a first panel positioned between the tab and one of the lugs with a surface of the panel engaging the second face of the tab, the panel thickness being approximately equal to the spacing between the tab and the said one lug,
   a second panel positioned between the spacer and the other of the lugs with a surface of the panel engaging the second face of the spacer, the panel thickness being approximately equal to the spacing between the spacer and the said other of the lugs, and
   means for drawing the lugs toward each other to firmly grasp the panels.

* * * * *